(12) United States Patent
Yde-Andersen et al.

(10) Patent No.: US 10,964,488 B2
(45) Date of Patent: Mar. 30, 2021

(54) ELECTROCHEMICAL AND CAPACITATIVE ENERGY STORAGE DEVICE AND METHOD OF MANUFACTURE

(71) Applicant: INNOCELL APS, Svendborg (DK)

(72) Inventors: Steen Yde-Andersen, Svendborg (DK); Joergen Schjerning Lundsgaard, Svendborg (DK)

(73) Assignee: INNOCELL APS, Svendborg (DK)

( * ) Notice: Subject to any disclaimer, the term of this patent is extended or adjusted under 35 U.S.C. 154(b) by 99 days.

(21) Appl. No.: 16/466,671

(22) PCT Filed: Dec. 13, 2017

(86) PCT No.: PCT/EP2017/082595
§ 371 (c)(1),
(2) Date: Jun. 5, 2019

(87) PCT Pub. No.: WO2018/108994
PCT Pub. Date: Jun. 21, 2018

(65) Prior Publication Data
US 2019/0295781 A1    Sep. 26, 2019

Related U.S. Application Data

(60) Provisional application No. 62/433,354, filed on Dec. 13, 2016.

(51) Int. Cl.
| | |
|---|---|
| *H01G 11/08* | (2013.01) |
| *H01G 11/12* | (2013.01) |
| *H01G 11/16* | (2013.01) |
| *H01G 11/84* | (2013.01) |
| *H01M 16/00* | (2006.01) |

(Continued)

(52) U.S. Cl.
CPC .............. *H01G 11/08* (2013.01); *H01G 11/12* (2013.01); *H01G 11/16* (2013.01); *H01G 11/84* (2013.01); *H01M 16/00* (2013.01); *H01M 16/003* (2013.01); *H02J 7/0013* (2013.01); *H01G 11/10* (2013.01); *H01L 31/053* (2014.12);
(Continued)

(58) Field of Classification Search
None
See application file for complete search history.

(56) References Cited

U.S. PATENT DOCUMENTS

| | | | | |
|---|---|---|---|---|
| 2012/0114982 A1* | 5/2012 | Mitsuda | ............... | H01M 2/26 429/9 |
| 2013/0345695 A1* | 12/2013 | McPherson | ............ | H01Q 1/248 606/34 |

(Continued)

FOREIGN PATENT DOCUMENTS

WO    2018001430    1/2018

OTHER PUBLICATIONS

International Search Report and Written Opinion in PCT/EP2107/082595 dated May 4, 2018.

(Continued)

*Primary Examiner* — Dion Ferguson
(74) *Attorney, Agent, or Firm* — Licata & Tyrrell P.C.

(57) ABSTRACT

Devices which internally control and regulate voltage of a super-capacitor cell or stack thereof during charge-discharge cycles, methods for controlling and regulating voltage of a super-capacitor cell or stack thereof with these devices and methods for production of the devices are provided.

11 Claims, 3 Drawing Sheets

(51) Int. Cl.
*H02J 7/00* (2006.01)
*H01L 31/053* (2014.01)
*H02J 7/34* (2006.01)
*H02J 7/35* (2006.01)
*H01G 11/10* (2013.01)

(52) U.S. Cl.
CPC .............. *H02J 7/345* (2013.01); *H02J 7/35* (2013.01); *Y02E 60/13* (2013.01); *Y02P 90/40* (2015.11)

(56) References Cited

U.S. PATENT DOCUMENTS

2016/0042877 A1* 2/2016 Kokotov ............... H01G 11/38 361/502
2016/0261005 A1* 9/2016 Rustomji .............. H01G 11/60
2016/0285137 A1* 9/2016 Gayden ............ H01M 10/4264

OTHER PUBLICATIONS

International Preliminary Report on Patentability in PCT/EP2107/082595 dated Jun. 18, 2019.

* cited by examiner

ELECTROCHEMICAL AND CAPACITATIVE ENERGY STORAGE DEVICE AND METHOD OF MANUFACTURE

This patent application is the National Stage of International Application No. PCT/EP2017/082595 filed Dec. 13, 2017, which claims the benefit of priority from U.S. Provisional Application No. 62/433,354, filed Dec. 13, 2016, teachings of each of which are herein incorporated by reference in their entirety.

FIELD OF THE INVENTION

The present invention relates to devices which internally control and regulate voltage of a super-capacitor cell or stack thereof during charge-discharge cycles, methods for controlling and regulating voltage of a super-capacitor cell or stack thereof with these devices and methods for production of the devices.

BACKGROUND

Super-capacitors have advantages in electrical applications where a large amount of power is conducted for a relatively short time and where a high number of charge/discharge cycles and longer lifetime is required. Typical applications cover a range from milliamp currents or milliwatts of power for up to a few minutes to high current at power up to several hundred kilowatts for shorter periods. However, Equivalent Series Resistance, heat transfer and diffusivity must be controlled to prevent detrimental effects to cell life. Further, stability must be adequately handled.

Among the earliest uses for super-capacitors were motor startup in cold conditions for large engines in tanks and submarines. Super-capacitors are currently employed in electronic equipment including memory backup, energy storage, higher power demand for a long time operation, instantaneous power, for applications that requires relatively high current units or peak currents ranging up to several hundreds of amperes.

Additional special applications include fixed electric double-layer capacitors for use in electronic equipment, electric double-layer capacitors for power applications, and electric double-layer capacitors for use in hybrid electric vehicles, railway applications and rolling stock equipment.

Super-capacitors buffer the battery, handling short current peaks, reducing cycling and extending battery life. Super-capacitor/battery combinations in electric vehicles (EV) and hybrid electric vehicles (HEV) are well investigated. A 20 to 60% fuel reduction in electric vehicles or hybrid electric vehicles has been described by recovering brake energy.

Toyota's Yaris Hybrid-R concept car uses a super-capacitor to provide bursts of power. PSA Peugeot Citroën has started using super-capacitors as part of its stop-start fuel-saving system, which permits faster initial acceleration. A triple hybrid forklift truck uses fuel cells and batteries as its primary energy storage and super-capacitors to buffer power peaks by storing braking energy. They provide the fork lift with peak power over 30 kW. The triple-hybrid system offers over 50% energy savings compared with diesel or fuel-cell systems. Maxwell Technologies, an American super-capacitor manufacturer, disclosed that more than 20,000 hybrid buses use the devices to increase acceleration, particularly in China. In 2014 China began using trams powered with super-capacitors that are recharged in 30 seconds by a device positioned between the rails.

However, while super-capacitors charge much faster than batteries and exhibit stable electrical properties, a broader temperature range, and a longer lifetime, their weight, volume and especially cost mitigate these advantages. Further, the lower specific energy density of super-capacitors makes them unsuitable for use as a stand-alone energy source for long distance transport. For long distance driving the advantage decreases rapidly. It is thus necessary to devise combinations of devices with high specific energy density with ancillary devices that can discharge at a much higher power density. Such combinations of devices must necessarily have a restricted volume and mass in order to provide economic feasibility.

Super-capacitor cells can be connected in series to form a super-capacitor stack to reach a suitable arbitrary potential needed for the relevant application. However, differences between the individual capacitors in a stack of serially connected single capacitors can lead to imbalanced cell voltages. The single cells of the stack develop undesired variability on repeated recharging due to the cumulative effect of minor differences in leak voltage in the single cells. Single capacitors in the stack thereby fail due to overcharging leading to reduced life and performance.

The problem may be solved by connecting an external electrical circuit to each cell in the stack. However, such solutions are currently cumbersome and costly and involve individual connection procedures for each cell in the stack.

For example, a super-capacitor stack is normally protected by an external electronic circuit connected to each cell ranging from passive to active circuits such as a resistor, Zener diode, switched-resistor, or a DC/DC-converter-circuit. In all of these cases, however, the energy associated with the over voltages is dissipated into the circuit or redistributed between neighboring cells resulting in energy loss, complex design, and cumbersome manufacture.

The present invention provides a means of achieving the same benefits through functional integration of the electrochemical cell or primary source of electrical energy and a super-capacitor.

SUMMARY

An aspect of the present invention relates to a device which internally controls and regulates voltage of a super-capacitor cell or stack thereof during charge-discharge cycles. The device of the present invention comprises a super-capacitor cell or stack thereof wherein the super-capacitor cell comprises a top current collector, a top super-capacitor electrode, a super-capacitor electrolyte membrane, a bottom super-capacitor electrode and a bottom current collector. The device further comprises an energy source internally connected to the super-capacitor cell or stack thereof.

In one nonlimiting embodiment, the super-capacitor cell or stack thereof and the energy source are connected in parallel between the top current collector and the bottom current collector of the super-capacitor cell or stack thereof. In this nonlimiting embodiment, an air gap or insulating material may be used to separate the super-capacitor cell or stack thereof from the energy source.

In another nonlimiting embodiment, the top super-capacitor electrode, the super-capacitor electrolyte membrane, and the bottom super-capacitor electrode of the super-capacitor cell or stack thereof are embedded within the energy source between the top current collector and the bottom current collector of the super-capacitor cell or stack thereof.

In one nonlimiting embodiment, the energy source of the device is a battery, a fuel cell, a solar cell or any combination thereof.

In one nonlimiting embodiment, the device of the present invention is manufactured by a coating method.

Another aspect of the present invention relates to a method for internal voltage regulation and balancing of a super-capacitor cell or stack thereof. In this method, the a super-capacitor cell comprising a top current collector, a top super-capacitor electrode, a super-capacitor electrolyte membrane, a bottom super-capacitor electrode and a bottom current collector, or stack thereof are internally connected with an energy source.

In one nonlimiting embodiment, the super-capacitor cell or stack thereof and the energy source are connected in parallel. In this embodiment, an air gap or insulating material may be used to separate the super-capacitor cell or stack from the energy source.

In another nonlimiting embodiment, components of the super-capacitor cell or stack thereof including the top super-capacitor electrode, the super-capacitor electrolyte membrane, and the bottom super-capacitor electrode, are embedded within the energy source between the top current collector and the bottom current collector of the super-capacitor cell or stack thereof.

In one nonlimiting embodiment, the energy source is a battery, a fuel cell, a solar cell or any combination thereof.

In one nonlimiting embodiment, the super-capacitor cell or stack thereof is internally connected with energy source by a coating method.

Yet another aspect of the present invention relates to a method for manufacturing a device which controls and regulates internally voltage of a super-capacitor cell or stack thereof during charge-discharge cycles. This method comprises coating components of a super-capacitor cell or stack thereof in connection internally with components of an energy source.

In one nonlimiting embodiment, the super-capacitor cell or stack thereof is coated parallel with the energy source. In this embodiment, an air gap or insulating material may be used to separate the super-capacitor cell or stack from the energy source.

In another nonlimiting embodiment, components of the super-capacitor cell or stack thereof are embedded within the energy source between the top current collector and the bottom current collector of the super-capacitor cell or stack thereof.

In one nonlimiting embodiment, the energy source is a battery, a fuel cell or a solar cell, or any combination thereof.

DETAILED DESCRIPTION

The invention relates devices and methods for production of devices which internally integrate a super-capacitor, also referred to as a double-capacitor or ultra-capacitor, or stack thereof, with an energy source.

In simplest form, the device of the present invention comprises a super-capacitor cell comprising a top current collector, a top super-capacitor electrode, a super-capacitor electrolyte membrane, a bottom super-capacitor electrode and a bottom current collector or a stack of these super-capacitor cells.

The device further comprises an energy source integrally connected to the super-capacitor cell or stack thereof.

In one nonlimiting embodiment, the energy source is connected in parallel to the super-capacitor cell or stack thereof.

In another nonlimiting embodiment, components of the super-capacitor cell or stack thereof are embedded within the energy source between the top current collector and the bottom current collector of the super-capacitor cell or stack thereof.

Any compatible renewable source of energy can be used as the energy source in the present invention. A nonlimiting example of an energy source useful in the present invention is a re-chargeable electrochemical cell which may be recharged from a primary energy conversion source such as a photovoltaic cell or a wide range of methods of supplying power. However, any cell type may be used if it meets the condition that the charged cell potential lies within the operational voltage limits of the super-capacitor it is connected to. Voltage regulation and cell balancing is obtained by integration of energy sources including, but in no way limited to, Zener diodes, batteries, solar cells, fuel cells, thermocouples, and mechanical to electrical power generators and any combinations thereof. Preferred is that the energy source used be compatible in the electric potential range and that it can be manufactured in accordance with established coating, printing or spraying technologies.

In some nonlimiting embodiments, a higher potential cell, such as a rechargeable lithium cell having a potential exceeding the potential window of a super-capacitor having an aqueous electrolyte, may be used as the energy source and integrated with a super-capacitor. In this embodiment, the super-capacitor comprises a non-aqueous organic electrolyte and an asymmetric electrode material such as, but not limited to, a cobalt oxide based material thus raising the maximum potential of each super-capacitor cell in the stack to a maximum of approximately 4.1V.

Various nonlimiting embodiments of devices of the present invention are depicted in FIGS. 1-6.

Figure 1:
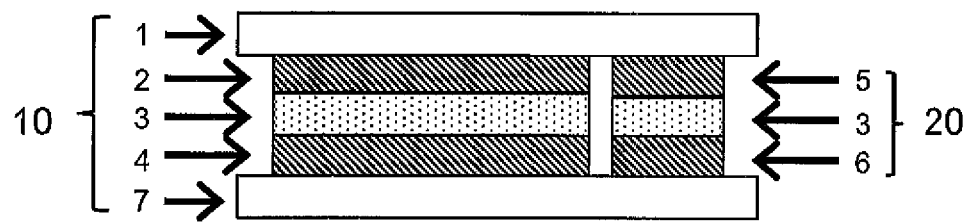
FIG. 1 is a diagram depicting a cross section of a nonlimiting embodiment of a super-capacitor of the present invention wherein a single super-capacitor is connected in parallel with an integrated electrochemical cell to provide voltage protection.

FIG. 1 illustrates the basic integration of a single electrochemical cell as the energy source with the associated super-capacitor connected in parallel. As shown therein, the super-capacitor 10 comprises a top current collector 1 adjacent to a top super-capacitor electrode 2, an electrolyte membrane 3, a bottom super-capacitor electrode 4 and a bottom current collector 7. Connected in parallel to the super-capacitor 10 is the single electrochemical cell 20, also referred to herein as a battery, comprising a negative battery electrode 5 and a positive battery electrode 6 separated by an electrolyte membrane 3.

Figure 2:
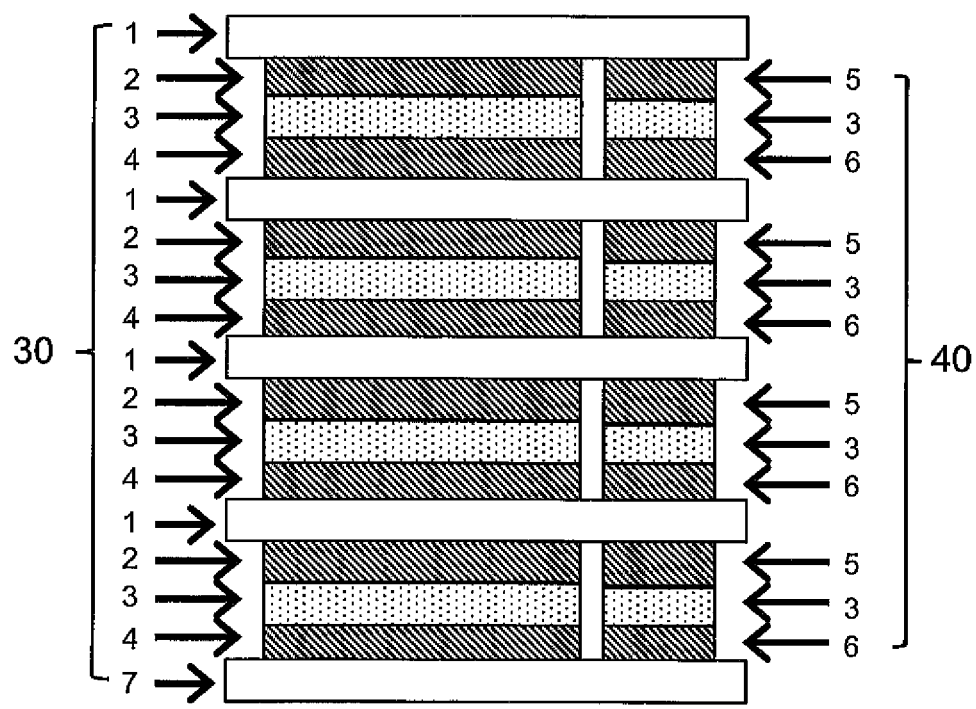
FIG. 2 is a diagram depicting a cross section of an alternative nonlimiting embodiment of a super-capacitor of the present invention as a side-by-side configuration comprising multiple cells, each connected to the associated super-capacitor cell and forming two stacks, one of electrochemical cells and another of the associated super-capacitor cells that are connected in parallel. Parallel connected electrochemical battery stack and super-capacitor stack. (Cross-section view)—The numeric indicators have identical properties as the co-responding indicators in FIG. 1.

FIG. 2 illustrates a nonlimiting embodiment comprising a super-capacitor stack 30 in a side-by-side configuration with stacked electrochemical cells or batteries 40, each connected to the associated super-capacitor cells in parallel.

In the nonlimiting embodiments depicted in FIGS. 1 and 2, an air gap separates the super-capacitor cell or stack from the energy source. In an alternative embodiment, an electrical insulating material may be used. These materials are characterized as having a very low electrical conductivity. Examples of electrical insulating materials with can be used include, but are not limited to, rubber-like polymers and most plastics. Alternatively, materials having the property of semiconduction may be used as well as ionically conducting materials such as polymeric perfluoro-sulfonates (PFSA) materials.

Figure 3:
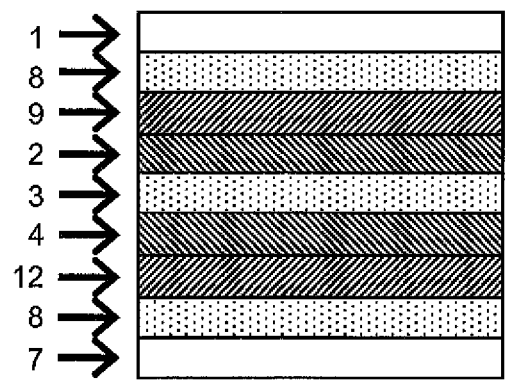
FIG. 3 is a diagram depicting a cross section of yet another embodiment of an integrated assembly of electrochemical fuel-cell and super-capacitor stack.

FIG. 3 shows another nonlimiting embodiment of the present invention with an integrated assembly of an energy source and a super-capacitor stack. In this nonlimiting embodiment, the energy source comprises a fuel cell. FIG. 3 shows that top current collector 1, followed by a fuel cell gas diffusion layer 8, followed by a negative fuel cell electrode 9, followed by the top super-capacitor electrode 2, followed by the electrolyte membrane 3, followed by the bottom super-capacitor electrode 4, followed by a positive fuel cell electrode 12, followed by a fuel cell gas diffusion layer 8 and a bottom current collector 7.

Figure 4:
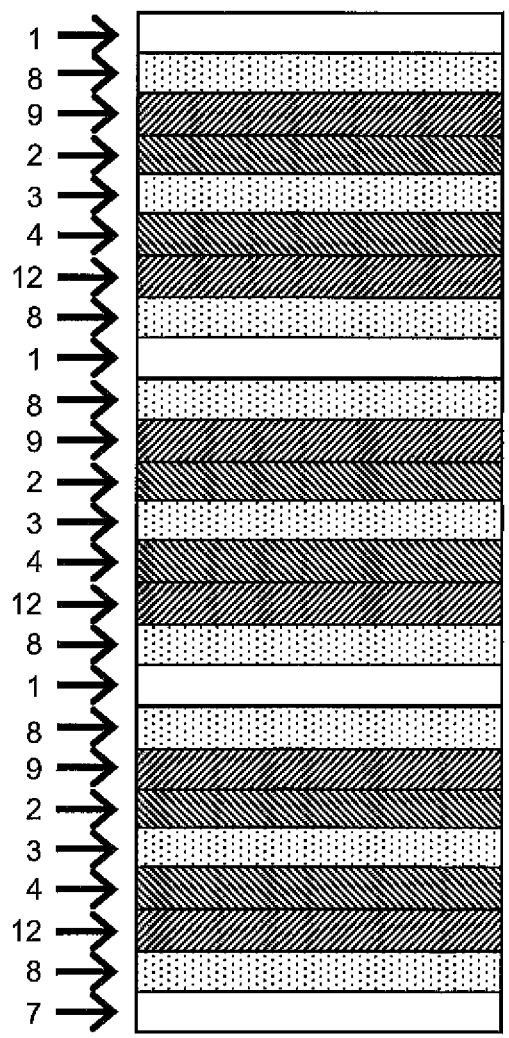
FIG. 4 is a diagram depicting a cross section of three cells in a similar configuration to FIG. 3 as a combined and integrated super-capacitor stack of the three cells. The numeric indicators have identical properties as the co-responding indicators in FIG. 3.

FIG. 4 illustrates a similar configuration to FIG. 3 with multiple super-capacitor cells and multiple fuel cells. The numeric indicators have identical properties as the co-responding indicators in FIG. 3.

Figure 5:
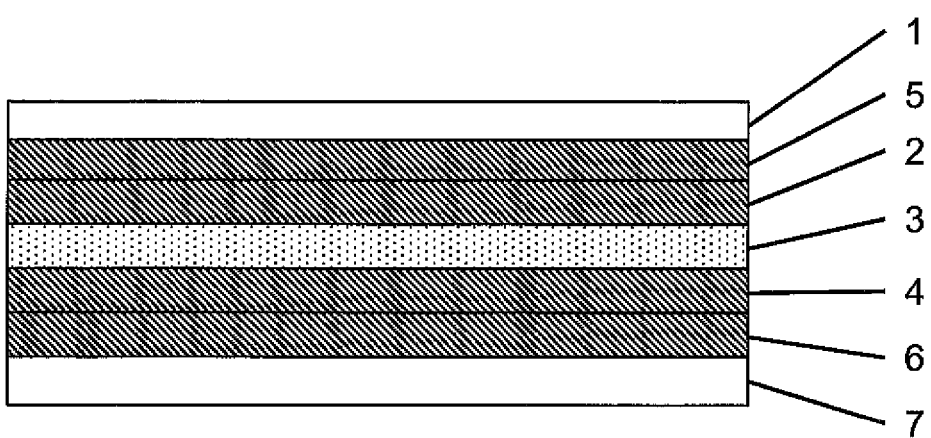
FIG. 5 shows a configuration of the present invention wherein a super-capacitor is embedded within a single electrochemical cell, in particular a battery cell.

FIG. 5 shows a configuration of the present invention wherein a super-capacitor is embedded within a single electrochemical cell, in particular a battery. FIG. 5 shows that top current collector 1, followed by a negative battery electrode 5, followed by the top super-capacitor electrode 2, followed by the electrolyte membrane 3, followed by the bottom super-capacitor electrode 4, followed by a positive battery electrode 6, and a bottom current collector 7.

High discharge rates lead to rapid resistive heating of the device. Accordingly, the current collectors of the device have dual functions of conducting considerable current and diffusing heat resulting from resistive heating to the surroundings. It is desirable that current drain is controlled within acceptable limits by means of restraint circuitry and that an adequate dispersal of heat from the device to surroundings. In one nonlimiting embodiment, a thermal diffuser, such as treated aluminum is applied. Suitable materials are characterized by chemical stability and the ability to conduct electrons adequately without leading to thermal degradation due to resistive heating. Nonlimiting examples of materials which can be used in the top and bottom super-capacitor current collectors of the present invention include metals such as aluminum, copper or nickel foil, graphite foil as well as bipolar plates fabricated from carbon composites containing graphite, graphene or conducting carbon fiber.

Nonlimiting examples of materials which can be used in the top and bottom super-capacitor electrodes include mixtures of activated high surface area carbon, binder and gelled or polymer electrolyte and activated high surface area carbon and a PFSA ionomer electrolyte.

Nonlimiting examples of materials which can be used in the electrolyte membrane include, gelled electrolytes in a porous separator, polymer electrolytes and perfluorosulfonic acid (PFSA) ionomer membranes.

In embodiments of the present invention wherein the energy source is a battery, nonlimiting examples of materials used in the negative battery electrode include mixtures of metal hydride powder, binder and gelled alkaline electrolyte as well as other appropriate electrode materials dependent upon the battery type selected. Nonlimiting examples of materials used in positive battery electrode include of e.g. nickel oxy-hydroxide powder, a binder and a gelled electrolyte. In this nonlimiting embodiment, a nickel-metal hydride (Ni-MH) cell or battery is used. However, as will be understood by the skilled artisan upon reading this disclosure, any type of rechargeable electrochemical cell that is compatible with the potential window of the integrated capacitor can be used as the energy source.

In one nonlimiting embodiment, a lead acid type battery can be used as the energy source.

In embodiments of the present invention wherein the energy source is a fuel cell, nonlimiting examples of materials which can be used in the negative fuel cell electrode include platinum/ruthenium catalyst and PFSA ionomer membranes electrolyte. Nonlimiting examples of materials used in the positive fuel cell electrode include platinum catalyst and PFSA ionomer electrolyte.

As will be understood by the skilled artisan upon reading this disclosure, alternative materials for components of the super-capacitors than those specifically disclosed herein as well as alternative materials for the components of the energy sources than those specifically disclosed herein and known to those skilled in the art can be used and are considered within the scope of the present invention.

The invention also relates to methods of producing super-capacitor cells or stacks thereof serially connected and/or integrated with an energy source which are maintained in balanced coordination and protected during charge and discharge thereby preventing cell over-voltage and cell imbalance which reduce the performance reliability and lifetime of such super-capacitor stacks. In this respect the use of established coating methods to fabricate thin and flexible layered composite devices is optimal. The manufacturing processes involved have become well established and those who are versed in the art of fabricating electrochemical cells such as lithium cells and are revealed in the prior art citations herein. The coating processes required to fulfill complex requirements of porosity, electronic and ionic conductivity for combined electrochemical devices and super-capacitors have become an established means of manufacture of the devices disclosed. The different layers in the super-capacitor laminate are made by successively applying the various superimposed layers. The method involves primarily coating an electrode onto a current collector followed by successive superimposition by coating the other functional layers.

The coating technique obviates the establishment of traditional and cumbersome means of connection in parallel of the electrochemical cell to the capacitor, thereby avoiding costly external circuits. The high energy density and low power density of the electrochemical cell is supplemented by the high intrinsic power density of the super-capacitor which has in general a limited energy density. This enables rapid and copious recharge cycles of the super-capacitor stack and voltage regulation and control of each super-capacitor in the stack.

The invention utilizes coating materials specifically adapted to integration of electrochemical cells and super-capacitors devices. Various coating materials known to those skilled in the art can be adapted for use in accordance with the present invention and applied in manufacture of the devices of the present invention via conventional coating processes such as described in published U.S. Patent Application Nos. 20080206616 and 20080075842, teachings of which are herein incorporated by reference.

For example, U.S. Published Patent Application 20080206616 discloses the formulation and processing of highly porous catalyst coated membranes, sprayable inks and processes for forming catalyst coated membranes all of which can be adapted for use in the present invention. The disclosed sprayable ink comprising catalyst particles, polymer electrolyte ionomer, and a vehicle for dispersing the catalyst particles and the polymer electrolyte ionomer as well as the disclosed process comprising the steps of depositing an ink comprising catalyst particles and a vehicle onto a membrane and vaporizing from 40 to 95 weight percent of the vehicle from the sprayed ink under conditions effective to form a catalyst layer on the membrane can be used in coating processes to produce the devices of the present invention.

In particular, the coating technique can be applied to the cathodic and anodic electrode materials as well as to the electrode materials of the super-capacitor. The same process equipment is also suitable for applying the electrolyte or semiconduction membrane materials. Those versed in the art of coating are aware of established techniques for satisfying the rheological demands of the process.

Another nonlimiting example of coatings and coating processes which can be adapted for use in the manufacture of the devices of the present invention includes the coatings and processes used for preparing catalyst coated membranes and membrane electrode assemblies for use in direct methanol fuel cells. In these processes, cathode and anode layers are formed by spraying catalyst-containing inks onto a novel framed electrolytic membrane to form a catalyst coated membrane. The spraying process optionally employs one or more masks, which carefully control where the catalyst-containing ink is deposited. Following application of the cathode and anode layers, diffusion layers are prepared and inserted onto the catalyst coated membranes, and pressed to form membrane electrode assemblies.

Methods of fabricating electrodes for super-capacitors such as disclosed in published U.S. Patent Application 20150318121A1, wherein the activated carbon is mixed with a binding material within a time period long enough for completion of the coagulation process, following which the mass thus obtained is packed to remove the dispersed medium and is used for formation (molding) of the electrodes, can be used in production of the super-capacitors of the devices of the present invention.

Another method for production of a super-capacitor which can be adapted for use in the device of the present invention is described by Wang et al. (Sci. China Technol. Sci. 2015 58: 1779. In this super-capacitor, pseudo-capacitance is produced from the electrode and the electrolyte of super-capacitors to simultaneously achieve high energy density and power density. Layered transition metal hydroxides (Ni(OH)2 and Co(OH)2) are introduced as electrodes, followed by exploration of the effect of the active materials and the substrate on the electrochemical behavior. Various redox electrolytes are utilized to improve the specific capacitance of an electrolyte. Using these disclosed methodologies, an appropriate electrode and a dedicated electrolyte can be selected in order to achieve high electrochemical performance of super-capacitors used in the devices of the present invention.

Additional methods and components which can be used for production of super-capacitors used in the devices of present invention are disclosed in Frontiers of Energy (A Review for Aqueous Electrochemical Supercapacitors, Article Date Aug. 5, 2015 18:33), the thesis of Steffen Thrane Vindt (Development of a Sustainable, Cost-Effective Supercapacitor for Energy Storage (SuperCap), PhD Thesis, University of Southern Denmark (2016)), Vindt et al. (Appl. Phys. A (2016) 122: 64) and In addition, published U.S. Patent Application 20030064265A1, teachings of which are incorporated by reference, discloses electro-catalyst powders and methods for producing electro-catalyst powders, such as carbon composite electro-catalyst powders, useful in production of the devices of the present invention. The powders have a well-controlled microstructure and morphology. The method includes forming the particles from an aerosol of precursors by heating the aerosol to a relatively low temperature, such as not greater than about 400° C. This coating technique is particularly useful in applying the cathodic and anodic electrode materials as well as the electrode materials of the super-capacitor.

Nonlimiting methodologies for production and the fuel cell components disclosed in Published U.S. Patent Application 20080286632A1, teachings of which are incorporated by reference, can also be used in the manufacture of devices of the present invention with this type of energy source.

Nonlimiting methods and components for fabricating solar cells such as described in published U.S. Patent Application 20080289683A1 as well as by Green, M. A. (Solar Energy 2003 74 (3): 181-192) can be used in the manufacture of devices of the present invention with this type of energy source.

Electrolytes that can remain stable up to 2.5V are useful in various batteries of high capacity and power density useful in the devices of the present invention. In one nonlimiting embodiment, wherein the energy source is a battery, a composition of an aqueous electrolyte comprising one or more non-aqueous solvents and a salt, which has a larger electrochemical stability window than a pure aqueous electrolyte is used. Example of other materials expected to be useful as 2.5 V aqueous hybrid electrolytes include, but are not limited to, activated carbon derived from pistachio nutshells (>2.400 m2, >200 F/g) prepared by pyrolysis at 300° C. followed by treatment with CaCl2 followed by KOH treatment and pyrolysis at 900° C., pyrolized sugar with graphene oxide, and high specific area graphite flakes prepared by treating graphitized bituminous coal with KOH.

Additional examples of electrolyte materials useful in energy sources of the present invention are disclosed by Zhong et al. (Chem. Soc. Rev. 2015 44: 7484).

Considerable advantages can be gained by producing a combined stack of high power density capacitors and selected energy source in accordance with the present invention to increase energy storage capacity and performance, reduce the mass of the device and utilize the space available for energy storage and transfer optimally. The integrated voltage balancing and protection circuit removes any need for an external circuit since the individual super-capacitor cell voltages and thereby also the individual super-capacitor charges and discharges are controlled by the integrated energy source leaving each cell at the same voltage after any charge or discharge period.

The following nonlimiting example is provided to further illustrate the present invention.

EXAMPLE

An aqueous capacitor having a potential window exceeding the conventional established maximum potential of 1.2V has been developed with a view of expanding the potential window to accommodate integration of alkaline batteries and rechargeable lead-acid type cells at 2.1V in a configuration of the type disclosed in FIG. 1. In this embodiment, the two types of cell are isolated from each other, each having its own separate electrolyte.

What is claimed is:

1. A device which internally controls and regulates voltage of a super-capacitor cell or stack thereof during charge-discharge cycles, said device comprising:
   a super-capacitor cell or stack thereof, said super-capacitor cell comprising a top current collector, a top super-capacitor electrode, a super-capacitor electrolyte membrane, a bottom super-capacitor electrode and a bottom current collector; and
   an energy source internally connected to the super-capacitor cell or stack thereof,
   wherein an air gap or insulating material separate the super-capacitor cell or stack thereof from the energy source, or
   wherein the top super-capacitor electrode, the super-capacitor electrolyte membrane, and the bottom super-capacitor electrode of the super-capacitor cell or stack thereof are embedded within the energy source between the top current collector and the bottom current collector of said super-capacitor cell or stack thereof.

2. The device of claim 1 wherein the super-capacitor cell or stack thereof and the energy source are connected in parallel between the top current collector and the bottom current collector of said super-capacitor cell or stack thereof.

3. The device of claim 1 wherein the energy source is a battery, a fuel cell or a solar cell or any combination thereof.

4. The device of claim 1 which is manufactured by a coating method.

5. A method for internal voltage regulation and balancing of a super-capacitor cell or stack thereof, said method comprising internally connecting components of a super-capacitor cell, said components comprising a top current collector, a top super-capacitor electrode, a super-capacitor electrolyte membrane, a bottom super-capacitor electrode and a bottom current collector or a super-capacitor stack thereof with an energy source,
   wherein an air gap or insulating material separate the super-capacitor cell or stack from the energy source, or
   wherein the top super-capacitor electrode, the super-capacitor electrolyte membrane, and the bottom super-capacitor electrode of the super-capacitor cell or stack thereof are embedded within the energy source between the top current collector and the bottom current collector of said super-capacitor cell or stack thereof.

6. The method of claim 5 wherein the super-capacitor cell or stack thereof and the energy source are connected in parallel.

7. The method of claim 5 wherein the energy source is a battery, a fuel cell or a solar cell or any combination thereof.

8. The method of claim 5 wherein the components of the super-capacitor cell or stack are internally connected with energy source by a coating method.

9. A method for manufacturing a device which controls and regulates internally voltage of a super-capacitor cell or stack thereof during charge-discharge cycles, said method comprising coating components of the super-capacitor cell or stack thereof in connection internally with components of an energy source,
   wherein an air gap or insulating material separate the super-capacitor cell or stack from the energy source, or
   wherein the top super-capacitor electrode, the super-capacitor electrolyte membrane, and the bottom super-capacitor electrode of the super-capacitor cell or stack thereof are embedded within the energy source between the top current collector and the bottom current collector of said super-capacitor cell or stack thereof.

10. The method of claim 9 wherein the super-capacitor cell or stack thereof are coated parallel with the energy source.

11. The method of claim 9 wherein the energy source is a battery, a fuel cell or a solar cell or any combination thereof.

* * * * *